United States Patent
Chu et al.

(10) Patent No.: US 6,207,491 B1
(45) Date of Patent: Mar. 27, 2001

(54) METHOD FOR PREVENTING SILICON SUBSTRATE LOSS IN FABRICATING SEMICONDUCTOR DEVICE

(75) Inventors: Huey-Chi Chu, Chung Ho; Yeh-Sen Lin, Pa Teh; Chia-Ching Tung, Kaohsiung, all of (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/258,087

(22) Filed: Feb. 25, 1999

(51) Int. Cl.[7] .................................................. H01L 21/8242
(52) U.S. Cl. .......................... 438/241; 438/239; 438/258
(58) Field of Search ..................................... 438/303, 241, 438/239, 253, 258, 200, 201, 266, 587, 588; 148/FOR 212, FOR 214

(56) References Cited

U.S. PATENT DOCUMENTS

| | | | |
|---|---|---|---|
| 5,324,680 | * 6/1994 | Lee et al. | 438/275 |
| 5,907,779 | * 5/1999 | Choi | 438/279 |
| 5,935,875 | * 8/1999 | Lee | 438/737 |
| 5,969,395 | * 10/1999 | Lee | 257/408 |
| 5,970,335 | * 10/1999 | Helm et al. | 438/233 |
| 6,022,776 | * 2/2000 | Lien et al. | 438/253 |

* cited by examiner

*Primary Examiner*—Michael Trinh
(74) *Attorney, Agent, or Firm*—Christensen O'Connor Johnson Kindness PLLC

(57) ABSTRACT

The present invention discloses a method for eliminating leakage current in a semiconductor device by preventing silicon loss in a first area of a substrate during fabricating the semiconductor device. The method according to the preferred embodiment of the present invention includes the following steps. Firstly, form a first gate structure on a second area of the substrate, and form a first structure together with a second structure on the first area of the substrate. Then form a dielectric layer on the topography of the wafer. Next, etch a thickness of the dielectric layer until about 200–1000 angstroms in thickness of the dielectric layer is remained. Subsequently, form a photoresist pattern on the first area of the substrate, and etch the exposed second portion of the dielectric layer to form spacers of the first gate structure. The spacers and the gate structure constitute a gate electrode of a first transistor. Next, form a source region and a drain region in the substrate, wherein the gate electrode, the source region, and the drain region constitute a first transistor, then remove the photoresist pattern. Finally, form a second transistor, a capacitor, and a control line in the first area of the substrate, wherein the first structure and the second structure is formed on the first area of the substrate.

18 Claims, 3 Drawing Sheets

METHOD FOR PREVENTING SILICON SUBSTRATE LOSS IN FABRICATING SEMICONDUCTOR DEVICE

BACKGROUND OF THE INVENTION

1. Field of the Invention

This invention relates to a method for preventing silicon substrate loss in fabricating a semiconductor device, and more particularly, to a method for reducing leakage current of the semiconductor device by preventing silicon substrate loss in fabricating a semiconductor device containing a periphery circuit and a memory cell.

2. Description of the Prior Art

A typical DRAM contains a periphery circuit region and a memory cell region. In fabricating a substrate is provided for fabricating the periphery circuit and a memory cell. The periphery circuit includes a row decoder, a column decoder, a refresh amplifier, a buffer, a register, a controller circuit, and a clock. The memory cell includes a transistor and a capacitor. All the forgoing devices in the memory cell region and the periphery circuit region are fabricated on the same substrate.

The leakage current of the device in the DRAM will result in serious problems such as frequent refresh operation to keep capacitors stored in capacitor of DRAM. Especially when fabricating the bit line or bit line in the memory cell region, the substrate loss is often resulted. The leakage current resulted from the substrate loss during fabricating the devices in the memory cell region is a problem caused by fabricating the semiconductor device.

As shown in FIG. 1, a gate structure 100 is formed on the substrate 101. The gate structure 100 includes the gate oxide layer 100a, a gate polysilicon layer 100b, and a gate silicide layer 100c. In addition, a control line structure 104 and a control gate structure 105 are formed on the substrate 101. Then a dielectric layer 110 is formed on the substrate, the gate structure 101, a control line structure 104, and a control gate structure 105. To form the spacer at the side-wall of the gate structure 100, an etch back process is utilized to anisotropically etch the dielectric layer 110. Because the silicon loss can not be avoided when etching the dielectric layer 110 to form the spacer, the silicon loss occurs on the whole surface of the exposed substrate 101.

Next, refer to FIG. 3, a photolithography process and an ion implantation step are subsequently used to form the source region 111 and drain region 112. When the photolithography process mentioned above is utilized to form the source and drain region in the periphery circuit region 115, a mask covering memory cell region is used to prevent the memory cell region 116 from implanting. After the forgoing step, traditional processes are utilized to fabricate the DRAM cell. Turning to FIG. 3, the gate structure 100 together with the etched dielectric layer 110 are used as the gate electrode of the transistor in the periphery circuit region 115. In the other respect, the control line structure 104 and the control gate structure 105 are in the memory cell region 116 of the substrate 101. Due to the global etching back performed to etch the dielectric layer 110, the silicon loss occurs on the exposed surface of the substrate 101 including the periphery region 115 and the memory cell region 116. Because the silicon loss occurred in the memory cell region 116, the leakage current will be resulted in the memory cell region.

SUMMARY OF THE INVENTION

Because the silicon substrate loss in the memory cell region will result in the leakage current in the memory device such as a DRAM. The present invention discloses a method for eliminating leakage current in a semiconductor device by preventing silicon loss in a memory cell region of a substrate during fabricating the memory device.

The method according to the preferred embodiment of the present invention includes the following steps. Firstly, form a first gate structure on a periphery circuit region of the substrate, and form a first structure together with a second structure on the memory cell of the substrate. Then form a dielectric layer on the topography of the wafer. Next, etch the dielectric layer until the thickness is about 200–1000 angstroms. Subsequently, form a photoresist pattern on the memory cell region, and etch the exposed second portion of the dielectric layer to form spacers of the first gate structure. The spacers and the first gate structure mentioned above constitute a gate electrode of a first transistor.

Next, form a source region and a drain region in the substrate, wherein the gate electrode, the source region, and the drain region constitute a first transistor, then remove the photoresist pattern. Finally, form a second transistor, a capacitor, and a control line in the first area of the substrate, wherein the first structure and the second structure is formed on the first area of the substrate. The charges stored in the capacitor are addressed and controlled by the second transistor, the control line, and the first transistor.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Figure 1:
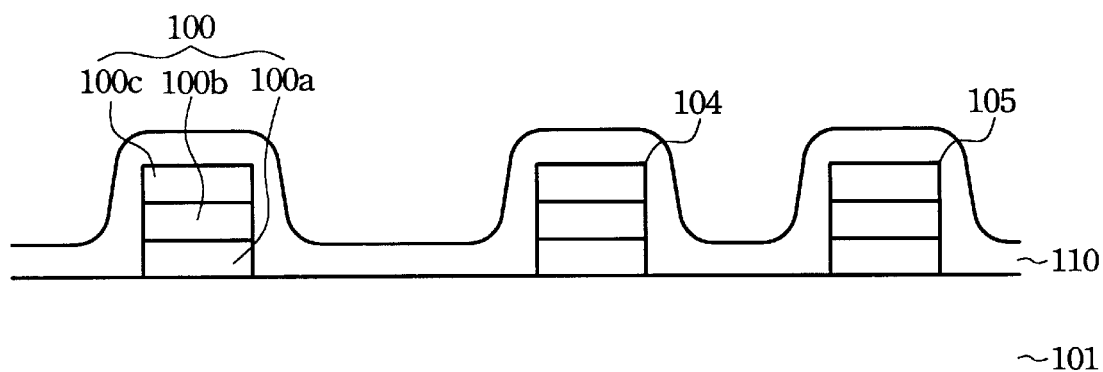
FIG. 1 is the cross sectional view of the wafer according to the prior art that a dielectric layer is formed on the surface of the periphery circuit area and memory cell area.
Figure 2:
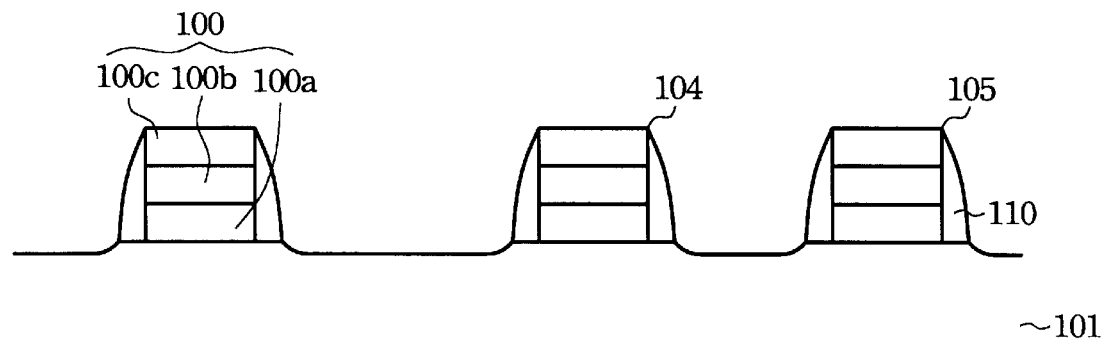
FIG. 2 is the cross sectional view of the wafer according to the prior art that the dielectric layer is removed and silicon loss is resulted on the exposed substrate when forming the spacer of a transistor.
Figure 3:
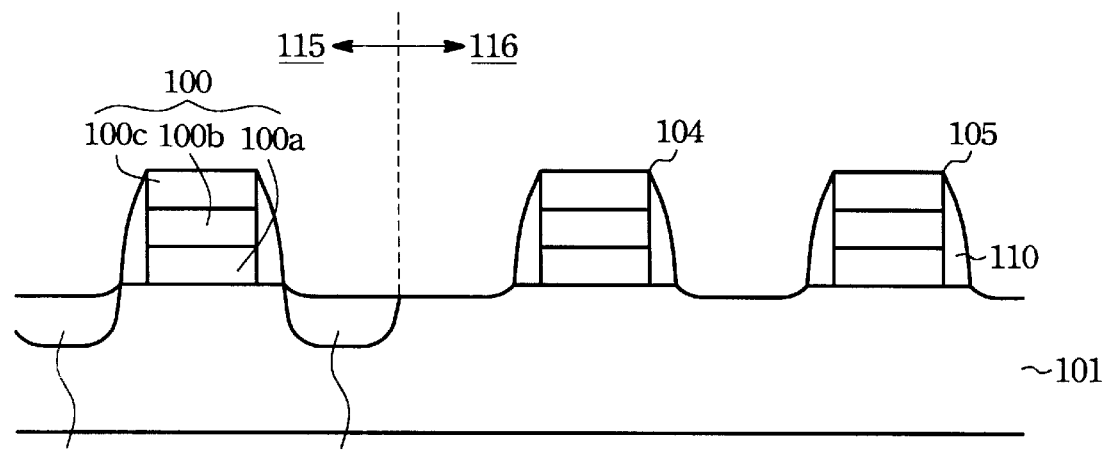
FIG. 3 is the cross sectional view of the wafer according to the prior art that the following processes are used to form the periphery circuit in the periphery circuit area, and form the memory cell in the memory cell area.
Figure 4:
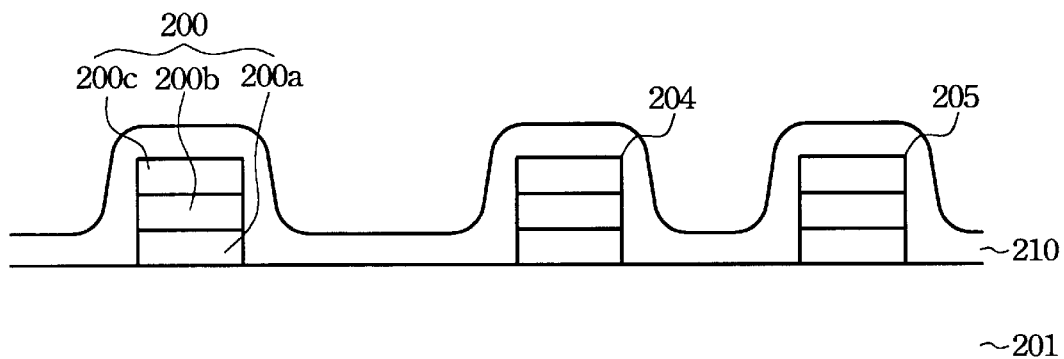
FIG. 4 is the cross sectional view of the wafer according to the preferred embodiment of the present invention that a dielectric layer is formed on the surface of the periphery circuit area and memory cell area.

The present invention proposes a method for etching back the spacer without substrate loss in the memory cell region of a memory device. By using the method of the preferred embodiment of the present invention, the silicon loss is averted, and the leakage current in the memory cell region is avoided without additional mask. One preferred embodiment of the present invention can be utilized to fabricate a memory device such as a dynamic random access memory. Refer to FIG. 4, a gate structure 200 is formed on the substrate 201. The gate structure 200 in the prefered embodiment of the present invention includes the first layer 200a, a second layer 200b, and third layer 200c. The first layer 200a, the second layer 200b, and the third layer 200c in the preferred embodiment of the present invention can be a gate oxide layer, a gate polysilicon layer, and a gate silicide layer respectively. In addition, the substrate in one preferred embodiment of the present invention can be a p-type silicon substrate.

Figure 5:
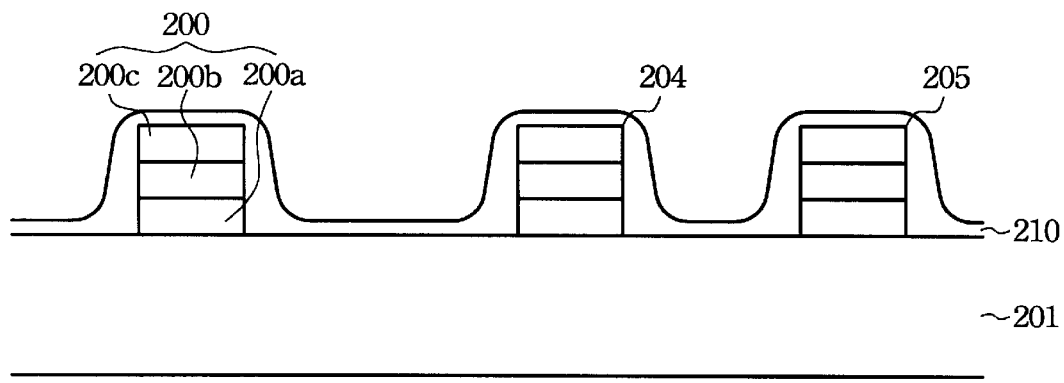
FIG. 5 is the cross sectional view of the wafer according to the prior art that the dielectric layer is partially etched until the thickness of the remained dielectric layer is reduced a certain thickness.

Then, a first structure 204 and a second structure 205 are formed on the substrate 201. In the preferred embodiment of the present invention, the first structure 204 and the second structure 205 can be a bit line or a gate electrode of a transistor. The first structure 204 and the second structure 205 in the preferred embodiment of the present invention both can be made of a gate oxide layer, a polysilicon layer, and a polysilicide layer. Subsequently, a dielectric layer 210 is formed on the substrate 201, the gate structure 200, a first structure 204, and a second structure 205. Subsequently, referring to FIG. 5, use a first etching process to etch the dielectric layer until the thickness of the dielectric layer is about 200–1000 angstroms. The dielectric layer 210 in the preferred embodiment of the present invention can be made of dielectric material such as silicon dioxide or silicon nitride.

Figure 6:
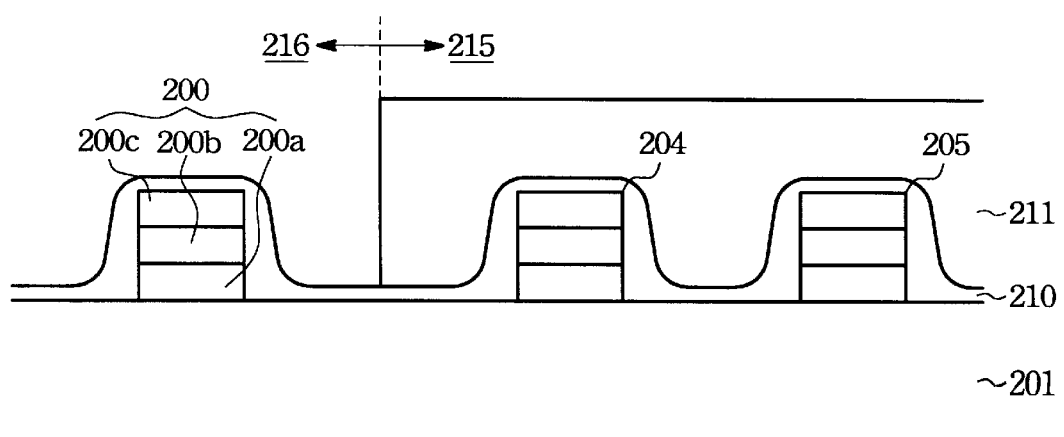
FIG. 6 shows that a photoresist pattern is form on the memory cell region and the exposed dielectric layer is etched continuously.
Figure 7:
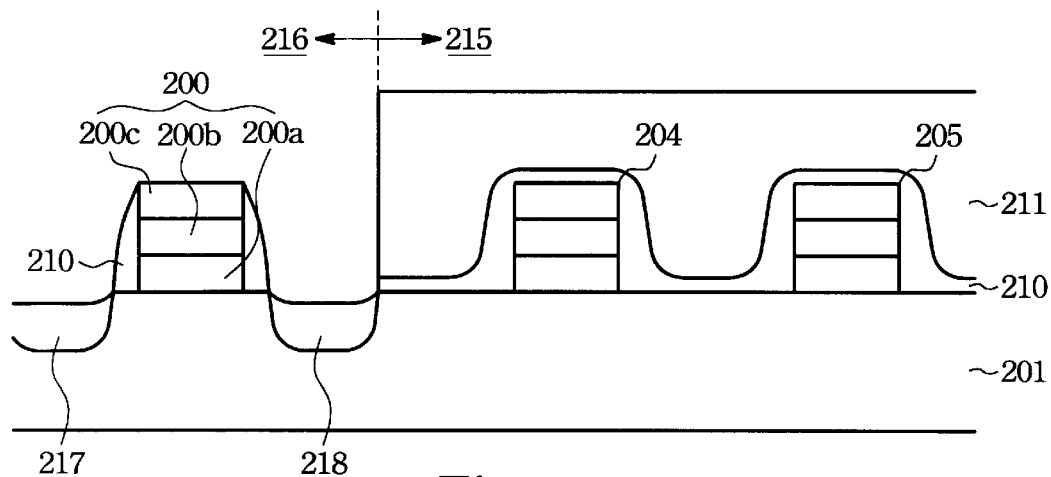
FIG. 7 shows that an ion implantation step is used to form the source and drain region of the transistor in the periphery circuit region.

To form the spacer at the side-wall of the gate structure 200, referring to FIG. 6, use a photolithography process to form a photoresist layer 211 on a memory cell region 215 including the first structure 204 and the second structure 205. When the photolithography process mentioned above is utilized, the photoresist layer 211 acting as a mask covering memory cell region 215 is used to prevent the memory cell region 215 from implanting. The exposed portion of the dielectric layer 210 is in a periphery circuit region 216. Then using the photoresist layer 211 as a mask in a second etching process to etch the exposed dielectric layer 210 and form the spacer at the side-wall of the gate structure 200 in the periphery circuit region 216. Thus the dielectric layer 210 in the periphery circuit region 216 is etched, refer to FIG. 7, the silicon loss occurred in the periphery circuit region 216. On the contrary, the memory cell region 215 is protected from been etching by the photoresist layer 211, and the silicon loss in the substrate 201 is thus prevented. Next, use an ion implantation step to form a source and drain region in the periphery circuit region 216.

Figure 8:
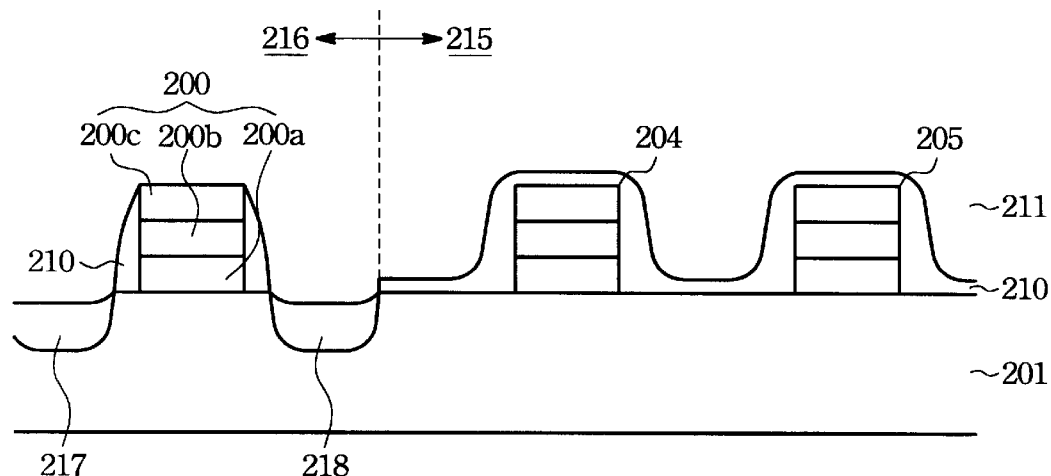
FIG. 8 shows the photoresist pattern is removed and the periphery circuit and the memory cell are fabricated in the periphery circuit area and the memory cell area respectively to form the DRAM.

Referring to FIG. 8, remove the photoresist layer 211 and use the processes that used to form a transistor in the periphery circuit region 216 and form the control transistor as well as the bit line in the memory cell region 215. After the whole processes fabricating DRAM are finished, the gate structure 200 together with the etched dielectric layer 210 in the periphery circuit region 216 is the gate electrode of the transistor in the periphery circuit region 216. The source region 217 and the drain region 218 are the source electrode and the drain electrode of the transistor in the periphery circuit region 216 respectively. The first structure 204 and the second structure 205 in the memory cell region 215 can be a bit line or a gate electrode of a control transistor in the preferred embodiment of the present invention.

Because the photomask used in the forgoing photolithography step in the preferred embodiment of the present invention is also used in the prior art, there is no additional mask used in the present invention. Besides, the silicon loss in the memory cell region 215 is prevented, so the leakage current is averted even without additional photomask. Thus the method according to the preferred embodiment of the present invention can avoid the occurrence of the leakage current in the memory cell region 215 of a memory device.

As will be understood by persons skilled in the art, the foregoing preferred embodiment of the present invention is illustrative of the present invention rather than limiting the present invention. Having described the invention in connection with a preferred embodiment, for example, if the various recipe is used in the preferred embodiment to etch the various material composing the dielectric layer. As long as the memory cell region is masked when forming the spacer in the periphery circuit region of a semiconductor device, the modification relating to the other portion of the semiconductor device will now suggest itself to those skilled in the art. While the preferred embodiment of the invention has been illustrated and described, it will be appreciated that various changes can be made therein without departing from the spirit and scope of the invention.

What is claimed is:

1. A method for eliminating leakage current in a semiconductor device by preventing silicon loss in a first area of a substrate during fabricating said semiconductor device, said method comprising:

forming a first gate structure on a second area of said substrate, and a first structure together with a second structure on said first area of said substrate;

forming a dielectric layer on said first gate structure, said first structure, said second structure, and said exposed substrate;

etching a first portion of said dielectric layer to remain a second portion of said dielectric layer;

forming a photoresist pattern on said dielectric layer over said first area of said substrate;

etching said exposed second portion of said dielectric layer using said photoresist pattern as a mask to form spacers of said first gate structure, wherein said spacers and said gate structure constituting a gate electrode;

forming a source region and a drain region in said substrate, said gate electrode, said source region, and said drain region constituting a first transistor;

removing said photoresist pattern; and forming a second transistor, a capacitor, and a control line in said first area of said substrate by using said first structure and said second structure.

2. The method as claim 1, wherein said semiconductor device is a dynamic random access memory (DRAM).

3. The method as claim 1, wherein said first area of said substrate is provided to form a memory cell region of said semiconductor device, said second transistor, said capacitor, and said control line being formed in said memory cell region.

4. The method as claim 1, wherein said second area of said substrate is provided to form a periphery circuit region of said semiconductor device, said first transistor being formed in said periphery circuit region.

5. The method as claim 1, wherein said dielectric layer is chosen from a group consisting of: silicon dioxide and silicon nitride.

6. The method as claim 1, wherein said second portion of said dielectric layer is of a thickness about more than 200–1000 angstroms.

7. The method as claim 1, wherein charges stored in said capacitor being controlled by said second transistor, said control line, and said first transistor.

8. A method for eliminating leakage current in a semiconductor device by preventing silicon loss in a memory cell region of a substrate during fabricating said semiconductor device, said method comprising:

forming a first gate structure on a periphery circuit region of said substrate, and a first structure together with a second structure on said first area of said substrate, said semiconductor device being a dynamic random access memory (DRAM);

forming a dielectric layer on said first gate structure, said first structure, said second structure, and said exposed substrate;

etching a first portion of said dielectric layer to remain a second portion of said dielectric layer;

forming a photoresist pattern on said dielectric layer over periphery circuit region of said substrate;

etching said exposed second portion of said dielectric layer using said photoresist pattern as a mask to form spacers of said first gate structure, wherein said spacers and said gate structure constitute a gate electrode;

forming a source region and a drain region in said substrate, said gate electrode, said source region, and said drain region constituting a first transistor;

removing said photoresist pattern; and forming a second transistor, a capacitor, and a control line in said memory cell region of said substrate by using said first structure and said second structure.

9. The method as claim 8, wherein said second transistor, said capacitor, and said control line is formed on said memory cell region of said substrate.

10. The method as claim 8, wherein said first transistor is formed in said periphery circuit region of said substrate, charges stored in said capacitor being controlled by said second transistor, said control line, and said first transistor.

11. The method as claim 8, wherein said dielectric layer is chosen from a group consisting of: silicon dioxide and silicon nitride.

12. The method as claim 8, wherein said second portion of said dielectric layer is of a thickness about more than 200–1000 angstroms.

13. The method as claim 8, wherein charges stored in said capacitor being controlled by said second transistor, said control line, and said first transistor.

14. A method for eliminating leakage current in a semiconductor device by preventing silicon loss in a memory cell region of a substrate during fabricating said semiconductor device, said method comprising:

forming a first gate structure on a periphery circuit region of said substrate, and a first structure together with a second structure on said first area of said substrate, said semiconductor device being a dynamic random access memory (DRAM);

forming a dielectric layer on said first gate structure, said first structure, said second structure, and said exposed substrate;

etching a first portion of said dielectric layer to remain a second portion of said dielectric layer, a thickness of said second portion of said dielectric layer being of a thickness about more than 200–1000 angstroms;

forming a photoresist pattern on said dielectric layer over said periphery circuit region of said substrate;

etching said exposed second portion of said dielectric layer using said photoresist pattern as a mask to form spacers of said first gate structure, wherein said spacers and said gate structure constituting a gate electrode;

forming a source region and a drain region in said substrate, said gate electrode, said source region, and said drain region constituting a first transistor;

removing said photoresist pattern; and forming a second transistor, a capacitor, and a control line in said memory cell region of said substrate by using said first structure and said second structure, charges stored in said capacitor being controlled by said second transistor, said control line, and said first transistor.

15. The method as claim 14, wherein said second transistor, said capacitor, and said control line is formed on said memory cell region of said substrate.

16. The method as claim 14, wherein said first transistor is formed in said periphery circuit region of said substrate, charges stored in said capacitor being controlled by said second transistor, said control line, and said first transistor.

17. The method as claim 14, wherein said dielectric layer is chosen from a group consisting of: silicon dioxide and silicon nitride.

18. The method as claim 14, wherein said second portion of said dielectric layer is of a thickness about more than 200–1000 angstroms.

* * * * *